US006582834B2

(12) United States Patent
Nagaraj et al.

(10) Patent No.: US 6,582,834 B2
(45) Date of Patent: Jun. 24, 2003

(54) ANTI-STICK COATING FOR INTERNAL PASSAGES OF TURBINE COMPONENTS

(75) Inventors: Bangalore Aswatha Nagaraj, West Chester, OH (US); Ching-Pang Lee, Cincinnati, OH (US); William Randolph Stowell, Rising Sun, IN (US); Aaron Dennis Gastrich, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/879,691

(22) Filed: Jun. 12, 2001

(65) Prior Publication Data

US 2002/0187327 A1 Dec. 12, 2002

(51) Int. Cl.[7] .............................. B32B 15/04; F03B 3/12; C23C 16/06
(52) U.S. Cl. ....................... 428/632; 428/633; 428/469; 428/650; 428/680; 428/699; 428/701; 428/702; 428/336; 416/241 B; 427/252; 427/255.15; 427/255.19; 427/255.31; 427/255.32; 427/353
(58) Field of Search ................................. 428/469, 632, 428/633, 650, 680, 699, 701, 702, 336; 416/241 B, 241 R; 427/252, 255.19, 255.21, 255.15, 255.7, 353, 327, 255.31, 255.32

(56) References Cited

U.S. PATENT DOCUMENTS

| 5,851,679 | A | | 12/1998 | Stowell et al. |
| 6,207,295 | B1 | | 3/2001 | Stowell et al. |
| 6,296,447 | B1 | * | 10/2001 | Rigney et al. |
| 6,375,425 | B1 | * | 4/2002 | Lee et al. |
| 6,394,755 | B1 | * | 5/2002 | Stowell et al. |

* cited by examiner

Primary Examiner—Deborah Jones
Assistant Examiner—Jennifer McNeil
(74) Attorney, Agent, or Firm—David L. Narciso; Gary M. Hartman; Domenica N. S. Hartman

(57) ABSTRACT

An anti-stick coating that inhibits the adhesion of contaminants that form deposits on the internal cooling passages of gas turbine engine components. The anti-stick coating is formed as an outer coating of the internal cooling passages, and preferably overlies an environmental coating such as a diffusion aluminide coating formed on the passage surfaces. The outer coating has a thickness of not greater than three micrometers, and is resistant to adhesion by dirt contaminants as a result of comprising at least one layer of tantala, titania, hafnia, niobium oxide, yttria, silica and/or alumina. The outer coating is preferably deposited directly on the environmental coating by chemical vapor deposition.

20 Claims, No Drawings

ANTI-STICK COATING FOR INTERNAL PASSAGES OF TURBINE COMPONENTS

CROSS REFERENCE TO RELATED APPLICATIONS

Not applicable.

STATEMENT REGARDING FEDERALLY SPONSORED RESEARCH

Not applicable.

BACKGROUND OF THE INVENTION

1. Field of the Invention

This invention relates to protective coatings for components exposed to high temperatures within a chemically and thermally hostile environment. More particularly, this invention is directed to an anti-stick coating for the internal passages of gas turbine engine components, so as to inhibit the build up within the passages of deposits of adherent contaminants typically entrained in the inlet air of a gas turbine engine.

2. Description of the Related Art

The operating environment within a gas turbine engine is well known to be both thermally and chemically hostile. Nonetheless, higher operating temperatures for gas turbine engines are continuously sought in order to increase their efficiency. However, as operating temperatures increase, the high temperature durability of the components within the hot gas path of the engine must correspondingly increase. Significant advances in high temperature capabilities have been achieved through the formulation of nickel and cobalt-base superalloys. Nonetheless, when used to form components of the turbine, combustor and augmentor sections of a gas turbine engine, superalloys are often susceptible to damage by oxidation and hot corrosion attack and may not retain adequate mechanical properties.

A common solution is to protect the surfaces of such components with an environmental coating, i.e., a coating that is resistant to oxidation and hot corrosion. Coatings that have found wide use for this purpose include diffusion aluminide coatings and overlay coatings such as MCrAlX, where M is nickel, cobalt and/or iron and X is yttrium and/or another rare earth element. During high temperature exposure in air, these coatings form a protective aluminum oxide (alumina) scale that inhibits oxidation of the coating and the underlying substrate. Diffusion aluminide coatings are particularly useful for providing environmental protection to components equipped with internal cooling passages, such as high pressure turbine blades, because aluminides are able to provide environmental protection without significantly reducing the cross-sections of the cooling passages. However, with more advanced cooling designs having complex serpentine passages, certain surfaces may have diminished protection as a result of a very thin aluminide coating.

Hot corrosion of gas turbine engine components generally occurs when sulfur and sodium react during combustion to form sodium sulfate ($Na_2SO_4$), which condenses on and subsequently attacks the external component surfaces. Alkali sulfate contaminants also tend to deposit from the inlet air and cause corrosion of the internal cooling surfaces of air-cooled components. Sources of sulfur and sodium for hot corrosion reactions include impurities in the fuel being combusted as well as the intake of alkali laden dust and/or ingestion of sea salt. In the latter situation, hot corrosion typically occurs on hot section turbine blades and vanes under conditions where salt deposits on the component surface as a solid or liquid. The salt deposits can break down the protective alumina scale on a diffusion aluminide coating, resulting in rapid attack of the coating and the underlying superalloy substrate. Hot corrosion produces a loosely adherent external scale with various internal oxides and sulfides penetrating below the external scale. These products are generally sulfur and sodium compounds with elements present in the alloy and possibly other elements from the environment, such as calcium, magnesium, chlorine, etc. As such, hot corrosion products are distinguishable from oxides that normally form or are deposited on gas turbine engine components as a result of the oxidizing environment to which they are exposed.

The internal cooling passages of high pressure turbine components such as blades and vanes have been observed to be particularly susceptible to a build up of contaminants such as silica and alkaline metal-containing compounds, which tend to firmly adhere to the passage walls. The thickness of a layer of these accumulated contaminants can at times be in excess of 0.004 inch (about 0.1 millimeter), which not only reduces cooling flow but is also sufficiently thick to thermally insulate the walls of the cooling passages and reduce the effective height of any turbulence promoters within the passages. As a result, an air-cooled component may experience higher operating temperatures that can significantly reduce its service life. Finally, alkaline metal-containing compounds have been shown to promote hot corrosion attack of cooling passage surfaces during exposures to elevated temperatures.

In view of the above, the surfaces of gas turbine engine components are typically cleaned and, if necessary, their environmental coatings replaced or rejuvenated during engine overhaul and repair. During cleaning, any dirt or other foreign matter that has accumulated in the internal cooling passages of a component is also removed in order to restore cooling flow to an acceptable level and thereby promote the service life of the component. Though coating rejuvenation of gas turbine engine components is becoming more widely practiced, it is very difficult to clean and rejuvenate their internal cooling passages. Removal of contaminants of the type noted above is further complicated if the component has a complex cooling scheme. As a result, a gradual buildup of these contaminants often occurs, with the undesirable effect of reducing cooling efficiency, increasing component operating temperatures, and promoting hot corrosion attack. Vibratory tumbling techniques employed to clean gas turbine engine components have been successful at removing dirt from the external surfaces of gas turbine components, but with little affect on dirt, silica and calcium compounds adhered to the internal cooling passage surfaces of components. Removal of internal dirt and contamination by chemical treatments can be effective but may be impractical for field servicing, and may be aggressive toward the protective diffusion aluminide coating on the cooling passage walls.

From the above, it can be appreciated that the buildup of dirt and contaminants on the internal cooling surfaces of gas turbine engine components is detrimental to the service lives of such components, yet their removal can considerably complicate the cleaning and refurbishing of these components.

BRIEF SUMMARY OF THE INVENTION

The present invention generally provides an anti-stick coating that inhibits the adhesion of contaminants and dirt entrained in the inlet air of a gas turbine engine. More particularly, the anti-stick coating is formed as an outer coating of the internal cooling passages of a gas turbine engine component. The outer coating preferably overlies an environmental coating such as a diffusion aluminide coating formed on the passage surfaces. The outer coating has a thickness of not greater than three micrometers, and is resistant to adhesion by dirt contaminants as a result of comprising at least one layer of tantala ($Ta_2O_5$), titania ($TiO_2$), hafnia ($HfO_2$), niobium oxide ($Nb_2O_5$), yttria ($Y_2O_3$), silica ($SiO_2$) and/or alumina ($Al_2O_3$). Because of the internal surfaces being coated, the outer coating is preferably deposited on the environmental coating by a non-line-of-sight deposition process such as chemical vapor deposition (CVD).

Accordance to the invention, the no-stick outer coating significantly inhibits the adhesion of dirt and other contaminants on the walls of internal cooling passages, to the extent that a buildup of such contaminants does not occur or can be more easily removed during cleaning and refurbishment of the component. As a result, the outer coating of this invention is able to maintain an acceptable level of cooling efficiency for the component, thereby minimizing its operating temperatures, as well as inhibits hot corrosion attack during exposures to elevated temperatures. In addition, the outer coating achieves these benefits while eliminating or at least reducing the amount of vibratory tumbling or chemical treatment necessary to remove dirt from the internal surfaces of a component, thereby minimizing potential damage to the protective diffusion aluminide coating by such treatments.

Other objects and advantages of this invention will be better appreciated from the following detailed description.

DETAILED DESCRIPTION OF THE INVENTION

The present invention is generally applicable to components that are subjected to airborne contaminants present in the inlet air of a gas turbine engine. The invention is particularly directed to reducing the adhesion of such compounds and contaminants, which if not inhibited would lead to a buildup of dirt deposits that tenaciously adhere to the internal cooling passage surfaces of the component. Notable examples of such components include the high and low pressure turbine nozzles and blades, shrouds, combustor liners and augmentor hardware of gas turbine engines. Of particular interest to the invention are those components whose internal cooling passages are protected with an environmental coating, and particularly a diffusion aluminide coating including platinum aluminide (PtAl) coatings that are well known in the art. While the advantages of this invention will be described with reference to such components, the teachings of this invention are believed to be generally applicable to other components whose surfaces are susceptible to being coated with an adherent layer of contaminants.

In order to inhibit adhesion of dirt and other contaminants entrained in the cooling air flowing through an internal cooling passage, the present invention provides an anti-stick coating that forms the outermost surface of the cooling passages of a component. The anti-stick coating is preferably deposited directly on the environmental coating within the cooling passages, though it is foreseeable that the anti-stick coating could be deposited on an intermediate coating overlying the environmental coating. In a preferred embodiment in which the environmental coating is a diffusion aluminide or platinum aluminide coating, a layer of an alumina scale naturally develops on the environmental coating, and the anti-stick coating is deposited on this alumina scale layer. Various methods are known for depositing aluminide coatings, including vapor phase aluminizing, such that the deposition of such coatings will not be discussed in any detail here.

The anti-stick coating of this invention may consist of a single or multiple layers of one or more materials determined by this invention to have anti-stick properties with respect to dirt carried by air into the cooling passages of gas turbine engine components. Materials having these properties are the refractory oxides tantala ($Ta_2O_5$), titania ($TiO_2$), hafnia ($HfO_2$), niobium oxide ($Nb_2O_5$), yttria ($Y_2O_3$), silica ($SiO_2$) and alumina ($Al_2O_3$). In addition to inhibiting the adhesion of dirt and other contaminants, each of these materials has also been shown to minimize the adhesion of molten materials that may be in the hot gas path of a gas turbine engine. These materials are also advantageously chemically inert to diffusion aluminide coating materials, and have low dielectric constants to reduce a static charge that develops on the cooling passage surfaces and attracts particles. Tantala and silica are preferred materials for the anti-stick coating. The thickness of the anti-stick coating is preferably limited to not more than three micrometers in order to limit stress build-up in the coating. To minimize stresses and improve spallation resistance, the anti-stick coating can be formed of multiple layers of one or more of the above-noted coating materials, for example, multiple layers of tantala, multiple layers of silica, or multiple layers of both tantala and silica. A preferred coating thickness is at least one micrometer up to three micrometers, the lower limit of which is believed to be necessary to provide sufficient coverage to achieve the non-stick function of the coating.

While the anti-stick coating of this invention could be deposited by various methods, a preferred method is a low-temperature chemical vapor deposition (CVD) process, which is a non-line-of-sight process and therefore capable of uniformly depositing the anti-stick coating throughout the internal cooling passages of an air-cooled component. If the component is formed of a nickel-base or cobalt-base superalloy material, deposition temperatures of less than about 790° C. (about 1450° C.) are preferred so as not to impact the properties of the component, such as the dovetail of a high pressure turbine blade. After the environmental coating has been deposited, the anti-stick coating can be deposited on the internal cooling passage surfaces of the component by flowing the appropriate CVD gases directly into the internal cooling passages, such as through the opening in the dovetail of a turbine blade.

As a result of the anti-stick coating of this invention, the process of removing dirt and contaminants from the cooling passages is greatly simplified, and under some circumstances may even be unnecessary. Suitable treatments include waterflushing under pressure in accordance with known practices for cleaning the exterior surfaces of compressor blades of gas turbine engines.

While the invention has been described in term of a preferred embodiment, it is apparent that other form could be adopted by one skilled in the art, such as by substituting other suitable environmental coating and substrate materials, or by utilizing various methods for depositing the anti-stick coating. Accordingly, the scope of the invention is to be limited only by the following claims.

What is claimed is:

1. A gas turbine engine component having internal cooling passages, the internal cooling passages having surfaces on which there is an aluminide-containing environmental coating and an outer coating that is resistant to adhesion by dirt contaminants, the outer coating being uniformly deposited throughout the internal cooling passages to have a thickness of not greater than three micrometers and comprising at least one layer of at least one coating material selected from the group consisting of $Ta_2O_5$, $TiO_2$, $HfO_2$, $Nb_2O_5$, $Y_2O_3$, $SiO_2$ and $Al_2O_3$.

2. A gas turbine engine component according to claim 1, wherein the outer coating comprises multiple layers of at least two of the coating materials.

3. A gas turbine engine component according to claim 1, wherein the outer layer lies directly on the aluminide-containing environmental coating.

4. A gas turbine engine component according to claim 1, wherein the outer coating consists of $Ta_2O_5$ or $SiO_2$.

5. A gas turbine engine component according to claim 1, wherein the outer coating consists of multiple layers of $Ta_2O_5$ and/or $SiO_2$.

6. A gas turbine engine component according to claim 1, wherein the aluminide-containing environmental coating is a diffusion aluminide coating.

7. A gas turbine engine component having internal cooling passages, the internal cooling passages having surfaces on which there is a diffusion aluminide coating, an alumina scale layer on the diffusion aluminide coating, and an outer coating on the alumina scale layer, the outer layer being uniformly deposited throughout the internal cooling passages to have a thickness of at least one micrometer and not more than three micrometers, the outer layer being resistant to adhesion by silica and calcium compounds as a result of consisting of $Ta_2O_5$ and/or $SiO_2$.

8. A gas turbine engine component according to claim 7, wherein the outer coating consists of $Ta_2O_5$.

9. A gas turbine engine component according to claim 7, wherein the outer coating consists of $SiO_2$.

10. A gas turbine engine component according to claim 7, wherein the outer coating consists of multiple layers of $Ta_2O_5$ or $SiO_2$.

11. A method of inhibiting the adhesion of dirt contaminants to surfaces of internal cooling passages within a gas turbine engine component, the method comprising the steps of:
    depositing an aluminide-containing environmental coating so that the surfaces of the internal cooling passages; and then
    uniformly depositing an outer coating throughout the internal cooling passages, the outing coating being resistant to adhesion by the dirt contaminants, the outer coating being deposited to have a thickness of not greater than three micrometers and to comprise at least one layer of at least one coating material selected from the group consisting of $Ta_2O_5$, $TiO_2$, $HfO_2$, $Nb_2O_5$, $Y_2O_3$, $SiO_2$ and $Al_2O_3$.

12. A method according to claim 11, wherein the outer coating is deposited by chemical vapor deposition at a temperature of less than 790° C.

13. A method according to claim 11, wherein the outer coating comprises multiple layers of at least two of the coating materials.

14. A method according to claim 11, wherein the outer layer lies directly on the aluminide-containing environmental coating.

15. A method according to claim 11, wherein the outer coating consists of $Ta_2O_5$ or $SiO_2$.

16. A method according to claim 11, wherein the outer coating consists of multiple layers of $Ta_2O_5$ and/or $SiO_2$.

17. A method according to claim 11, further comprising the steps of flowing cooling air through the internal cooling passages such that dirt contaminants entrained in the cooling air deposit on surfaces of the outer coating within the internal cooling passages, and then removing the dirt contaminants from the surfaces of the outer coating by water-flushing under pressure.

18. A method of inhibiting the adhesion of silica and calcium compounds to surfaces of internal cooling passages within a gas turbine engine component the method comprising the steps of:
    depositing a diffusion aluminide coating by vapor phase aluminizing the surfaces of the internal cooling passages; and then
    depositing an outer coating by chemical vapor deposition at a temperature of less than 790° C., the outing coating being resistant to adhesion by the silica and calcium compounds, the outer coating being uniformly deposited throughout the internal cooling passages to have a thickness of at least one micrometer and not greater than three micrometers, the outer coating consisting of $Ta_2O_5$ and/or $SiO_2$.

19. A method according to claim 18, wherein the outer coating consists of multiple layers of $Ta_2O_5$ or $SiO_2$.

20. A method according to claim 18, further comprising the steps of flowing cooling air through the internal cooling passages such that silica and calcium compounds entrained in the cooling air deposit on surfaces of the outer coating within the internal cooling passages, and then removing the silica and calcium compounds from the surfaces of the outer coating by waterflushing under pressure.

* * * * *